(12) United States Patent
Mrvos et al.

(10) Patent No.: US 6,550,893 B2
(45) Date of Patent: Apr. 22, 2003

(54) SEMICONDUCTOR CHIP FOR AN INK JET PRINTHEAD AND METHOD FOR MAKING SAME

(75) Inventors: James Michael Mrvos, Lexington, KY (US); Carl Edmond Sullivan, Versailles, KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 10/047,055

(22) Filed: Jan. 14, 2002

(65) Prior Publication Data

US 2002/0118252 A1 Aug. 29, 2002

Related U.S. Application Data

(62) Division of application No. 09/795,731, filed on Feb. 28, 2001, now Pat. No. 6,387,719.

(51) Int. Cl.[7] .............................................. B41J 2/135
(52) U.S. Cl. ........................................... 347/44; 347/45
(58) Field of Search .......................... 347/44, 45, 54, 347/68; 438/21, 458; 216/27

(56) References Cited

U.S. PATENT DOCUMENTS

| 5,142,308 A | * | 8/1992 | Hasegawa et al. ...... 346/140 R |
| 5,907,333 A | * | 5/1999 | Patil et al. .................... 347/20 |
| 5,945,260 A | * | 8/1999 | Miyagawa et al. ......... 430/320 |
| 6,140,909 A | * | 10/2000 | Wu et al. .................... 338/308 |

* cited by examiner

Primary Examiner—Raquel Yvette Gordon
Assistant Examiner—An H. Do
(74) Attorney, Agent, or Firm—David E. LaRose; Jacqueline M. Daspit

(57) ABSTRACT

The invention provides a method for improving adhesion between a polymeric planarizing film and a semiconductor chip surface. The method includes deposition resistive, conductive and/or insulative materials to a seimconductor chip surface to provide a semiconductor chip for an ink jet printer. The chip surface is treated with a dry etch process under an oxygen atmosphere for a period of time and under conditions sufficient to activate the surface of the chip. A polymeric planarizing film is applied to the activated surface of the semiconductor chip. As a result of the dry etch process, adhesion of the planarizing film is increased over adhesion between the planarizing film and a semiconductor surface in the absence of the dry etch treatment of the chip surface.

16 Claims, 6 Drawing Sheets

SEMICONDUCTOR CHIP FOR AN INK JET PRINTHEAD AND METHOD FOR MAKING SAME

This is a divisional application of Ser. No. 09/795,731, filed on Feb. 28, 2001, now U.S. Pat. No. 6,387,719.

FIELD OF THE INVENTION

The invention relates to ink jet printers and to improved methods for making printheads for ink jet printers.

BACKGROUND

Ink jet printers continue to evolve to provide print engines having increased resolution at higher page throughput. However, higher throughput often means the printheads must operate with higher ejection frequencies which often increase the printhead temperature. Higher printhead operating temperatures and more chemically aggressive inks require more robust construction or modification in fabrication techniques to enhance the ability of the components of the printhead to withstand more extreme operating conditions and inks. For example, increased operating temperatures may cause failure of adhesives used to attached printhead components to one another. Failure of adhesion between protective layers attached to the semiconductor surface may invite corrosion from ink contact with unprotected surfaces including the electrical devices on the semiconductor surface.

What is needed therefore is an improved method for fabricating ink jet printheads to reduce the potential for corrosion from ink over the life of the printhead.

SUMMARY OF THE INVENTION

With regard to improving manufacturing techniques so as to provide printheads having increase reliability over the life thereof, a method for improving adhesion between a polymeric planarizing film and a semiconductor chip surface is provided. The method includes depositing resistive, conductive and/or insulative materials to a silicon wafer surface to provide semiconductor chips for ink jet printers. The wafer surface is treated with a dry etch process under an oxygen atmosphere for a period of time and under conditions sufficient to activate the surface of the wafer. A polymeric planarizing film is applied to the activated surface of the wafer. As a result of the dry etch process, adhesion between the planarizing film and the wafer surface is increased over adhesion between a planarizing film and a wafer surface in the absence of the dry etch treatment of the wafer surface.

In another aspect, the invention provides a semiconductor chip for an ink jet printhead. The chip includes silicon having a device surface and one or more metal or metal oxide layers providing active devices on the device surface. The device surface is activated for bonding a planarizing film thereto. A planarizing film is attached to and covers at least a portion of the activated surface of the semiconductor chip. The surface is activated by treating the surface with a dry etch process under oxygen atmosphere to provide increased adhesion between the planarizing film and the device surface.

An important advantage of the invention is that the printhead exhibits improved life even when operating at higher temperatures and when using more chemically aggressive inks. A factor in the improved life of the printhead is the decreased tendency for the planarizing film to delaminate from the device surface of the chip when a printhead is made by the process of the invention. Because the planarizing film of the invention is more prone to remain completely attached to the device surface, corrosion of the device surface by ink contact therewith is significantly reduced. In comparison, printheads made by planarizing unactivated device surfaces are more prone to delamination between the planarizing film and chip surface than printheads made according to the invention. Delamination of the planarizing film provides an avenue for ink corrosion of the device surface of the chip.

BRIEF DESCRIPTION OF THE DRAWINGS

Further advantages of the invention will become apparent by reference to the detailed description when considered in conjunction with the figures, which are not to scale, wherein like reference numbers indicate like elements through the several views, and wherein.

DETAILED DESCRIPTION OF THE INVENTION

Figure 1:
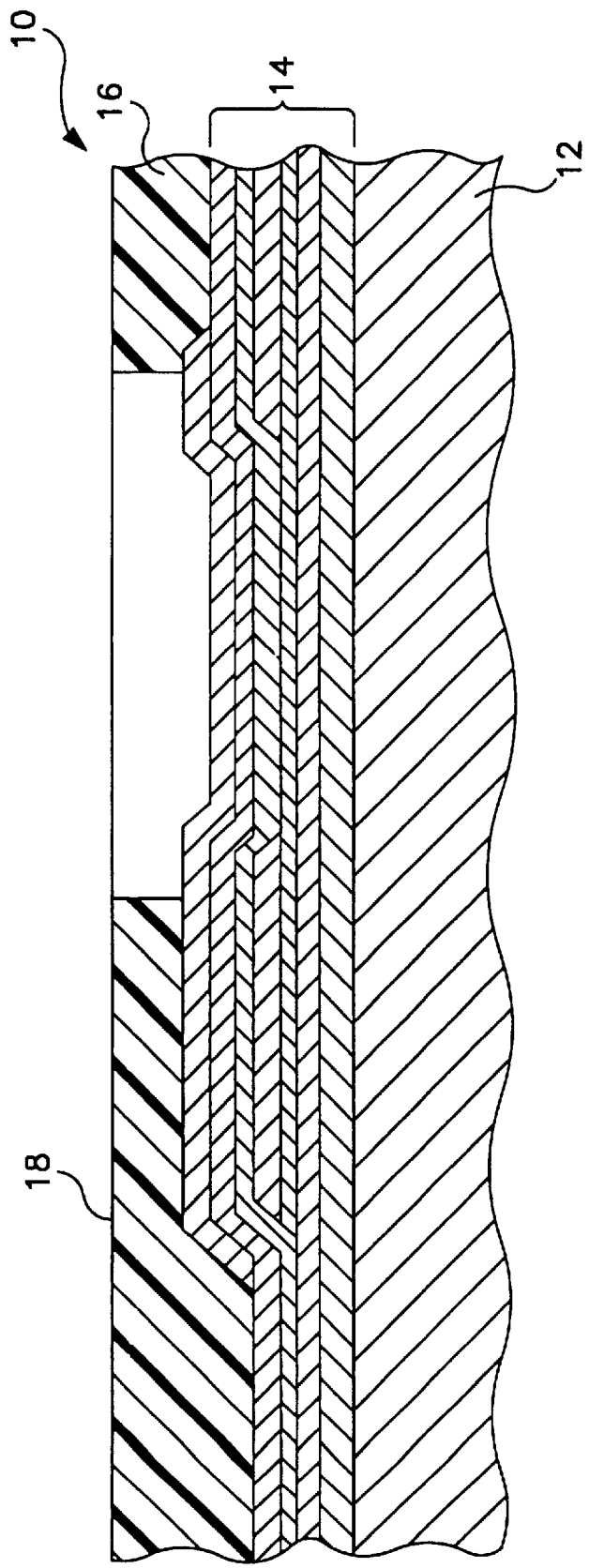
FIG. 1 is a cross-sectional view, not to scale, of a portion of semiconductor chip containing a planarizing surface applied to the chip according to the invention.

With reference to FIG. 1, a semiconductor chip 10 for an ink jet printhead is shown. The chip 10 includes a silicon substrate 12 containing a plurality of layers including insulating, conductive, resistive and passivating layers which together provide a device layer 14 on the silicon substrate 12. The chip 10 is made from a silicon wafer having a thickness ranging from about 200 to about 800 microns and the device layer 14 preferably has an overall thickness ranging from about 1 micron to about 5 microns, most preferably from about 2 to about 3 microns. A planarizing layer 16 is deposited over the device layer 14 to provide a substantially planar surface 18 for attaching a nozzle plate 20 (FIG. 2) thereto.

With regard to providing device layer 14, reference is made to FIGS. 3–7. The first layer applied to the silicon substrate 12 is an insulating layer 22 (FIG. 3) which is preferably a metal oxide layer, most preferably silicon dioxide having a thickness ranging from about 1.0 to about 2.0 microns. However, other passivating or insulating layers may be used for layer 22.

The next layer is a phosphorous silicon glass (PSG) layer 24 (FIG. 4) having a thickness ranging from about 1000 to about 1200 Ångstroms which is deposited over the insulating layer 22. Other materials which may be used for layer 24 include boron phosphorous silicon glass (BPSG) or other dielectric materials known to those skilled in the art. The PSG layer 24 is preferably deposited over the entire insulating layer 22 surface.

Figure 5:
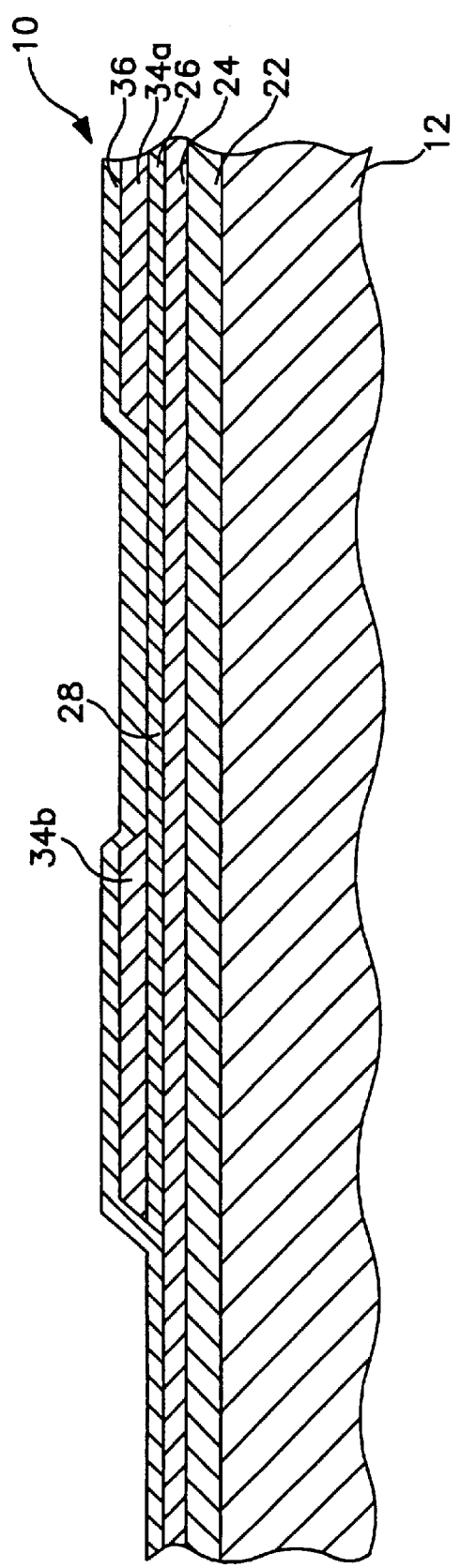

A resistive layer 26 of tantalum/aluminum, or alpha phase tantalum is next deposited on at least a portion of the PSG layer 24 (FIG. 5). The resistive layer 26 provides heater resistors 28 which are disposed adjacent an ink chamber 30 and ink ejection nozzle hole 32 (FIG. 2) provided in the nozzle plate 20 attached to the chip 10. Upon activation of the heater resistors 28, ink in the ink chamber 30 is heated and a portion of the heated ink vaporizes causing a gas bubble which urges ink from the ink chamber 30 through the nozzle hole 32. The resistive layer 26 preferably has a thickness ranging from about 900 to about 1100 Ångstroms.

Conductive layers 34a and 34b (FIG. 5) made of an aluminum/copper alloy, gold, beta phase tantalum, aluminum and the like are deposited on one or more portions of the resistive layer 26. The conductive layers 34a and 34b provide electrical connection between the resistors 28 and the printer controller. Conductive layers 34a and 34b each preferably have a thickness ranging from about 5000 to about 6000 Ångstroms.

In order to protect the conductive and resistive layers from ink corrosion, passivation layers 36 and 38 (FIGS. 5 and 6) are preferably deposited over the resistive layer 26 and conductive layers 34a and 34b. The passivation layers 36 and 38 may be a composite layer of silicon nitride and silicon carbide, or may be individual layers 36 and 38 of silicon nitride and silicon carbide, respectively. The passivation layers 36 and 38 are preferably deposited directly on the conductive layers 34a and 34b and the resistive layer 26. It is preferred that the silicon carbide layer 38 have a thickness ranging from about 2000 to about 3000 Ångstroms, most preferably about 2600 Ångstroms. The silicon nitride layer 36 preferably has a thickness ranging from about 4000 to about 5000 Ångstroms, most preferably about 4400 Ångstroms.

A cavitation or additional passivation layer 40 (FIG. 6) of tantalum or diamond like carbon (DLC) is preferably deposited over at least a portion of the passivation layers 36 and 38, most preferably adjacent the heater resistor 28 adjacent the ink chamber 30. The cavitation layer 40 provides protection to the heater resistor 28 during ink ejection operations which could cause mechanical damage to the heater resistor 28 in the absence of the cavitation layer 40. The cavitation layer 40 is believed to absorb energy from a collapsing ink bubble after ejection of ink from the nozzle hole 32. Cavitation layer thickness may range from about 2500 to about 7000 Ångstroms or more.

Figure 6:
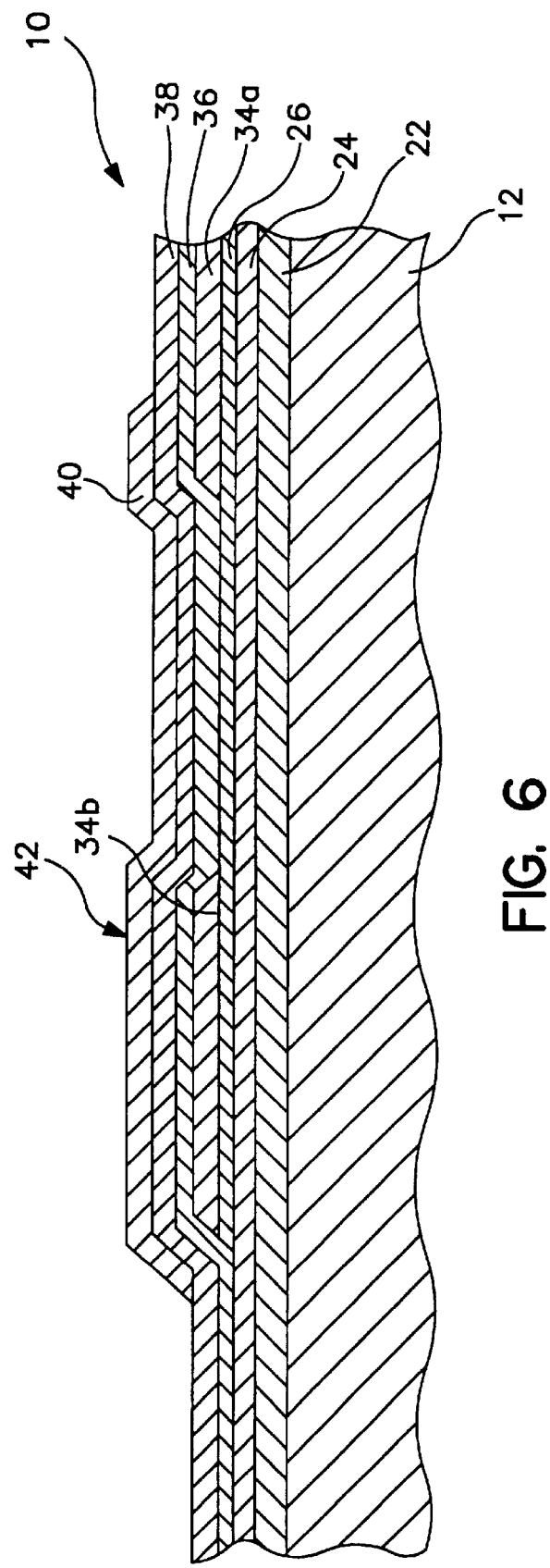
Figure 7:
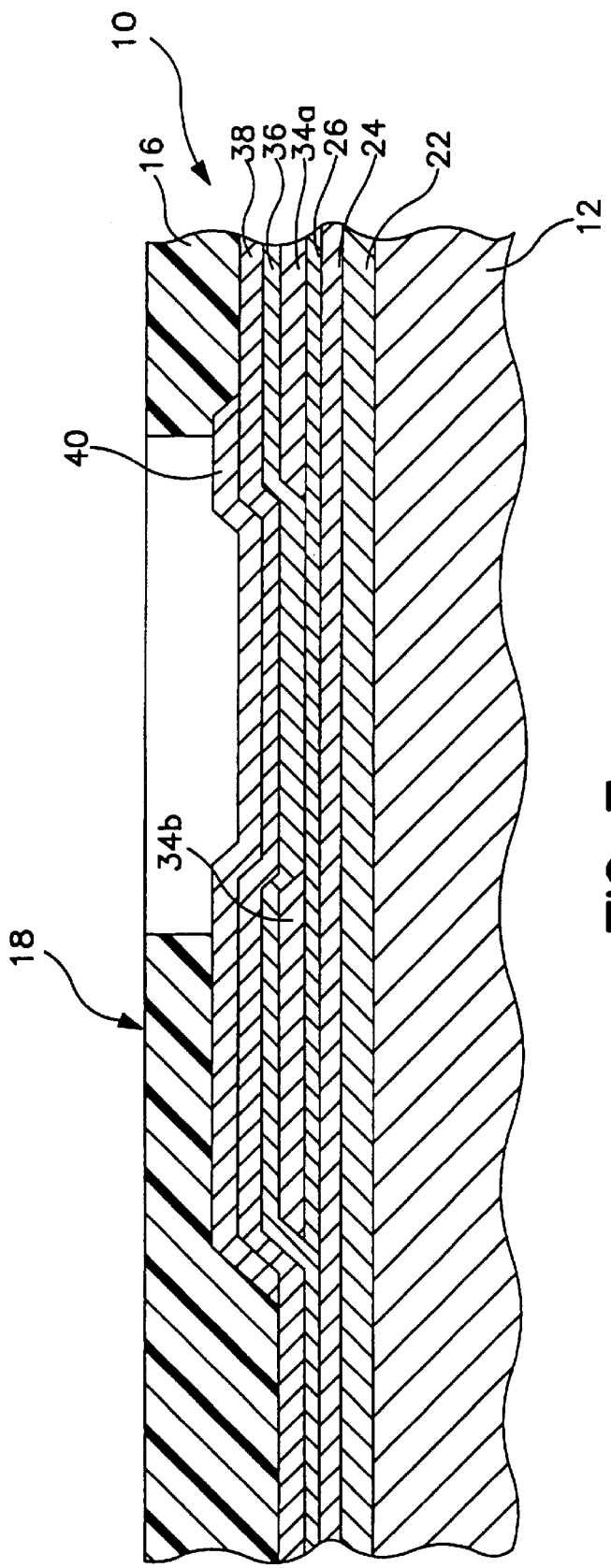

As seen in cross-sectional view in FIG. 6, the insulative, conductive, resistive and passivative layers providing device layer 14 deposited on the silicon 12 result in a non-planar chip surface 42. Each of these layers may be deposited and patterned as by conventional thin film integrated circuit processing techniques including chemical vapor deposition, photoresist deposition, masking, developing, etching and the like.

In order to adhesively attach the nozzle plate 20 to the chip surface 42, the planarizing layer 16 (FIG. 7) is preferably spun or coated onto the chip surface 42 as an intermediate layer to provide a planarized surface 18. The planarizing layer 16 is preferably a radiation and/or heat curable polymeric film layer preferably containing a difunctional epoxy material, a polyfunctional epoxy material and suitable cure initiators and catalyst. A suitable material for planarizing layer 16 is described in U.S. Pat. No. 5,907,333 to Patil et al., the disclosure of which is incorporated herein by reference as if fully set forth.

The planarizing layer 16 is relatively thick compared to the insulative, conductive, resistive and passivating layers described above and may have a thickness ranging from about 1 micron to about 20 microns, preferably about 2 to about 3 microns and most preferably about 2.5 microns. It is preferred to deposit the planarizing layer 16 over the entire chip surface 42 and then selective remove the layer in selected areas, i.e., "pattern" the layer, to provide the ink chamber 30 and electrical connections to conductive layers 34a and 34b on the chip 10. Patterning the planarizing layer 16 may be conducted by conventional photolithographic techniques.

Figure 2:
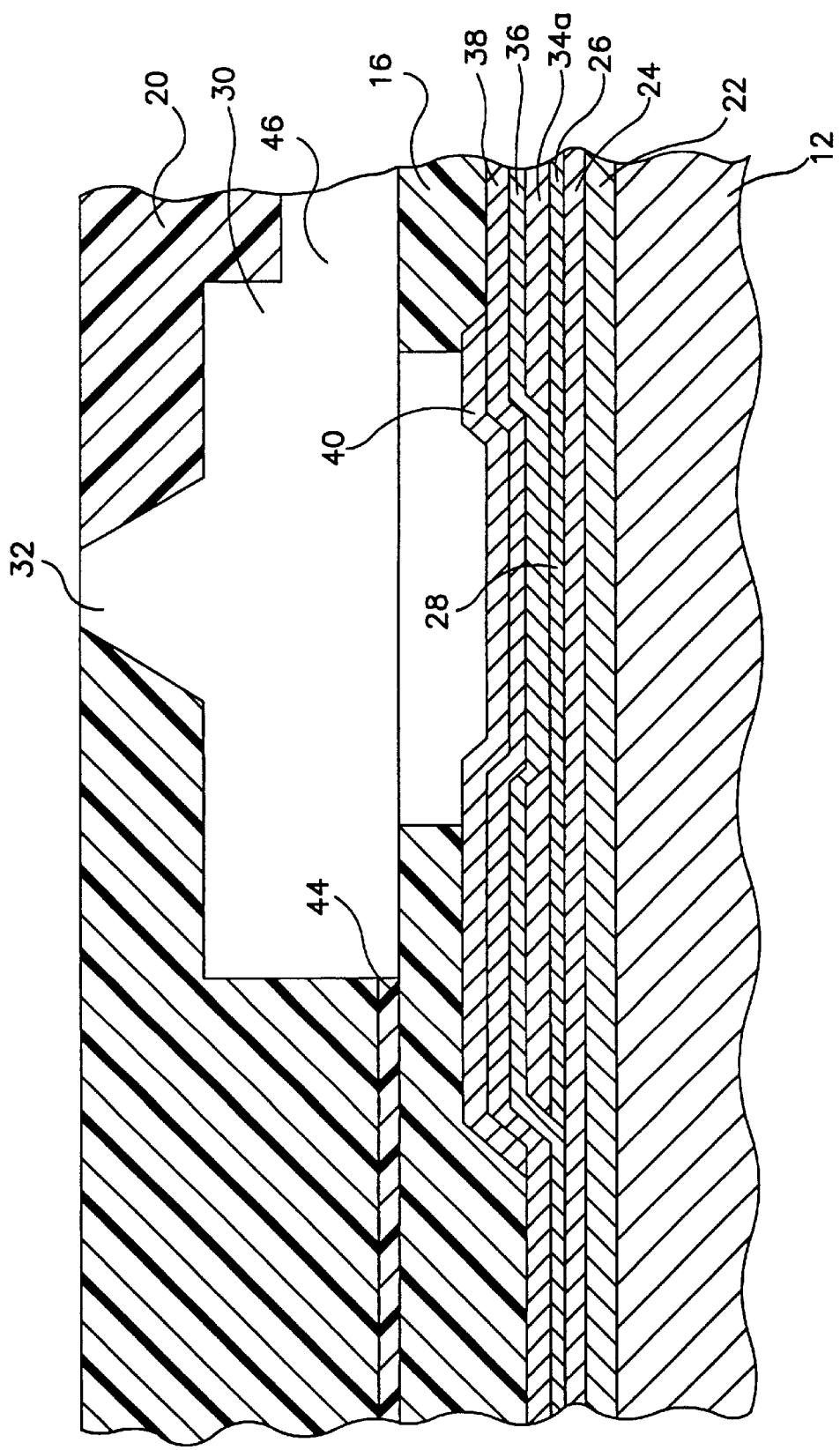
FIG. 2 is a cross-sectional view, not to scale, of a portion of a printhead made according to the invention.
Figure 3:
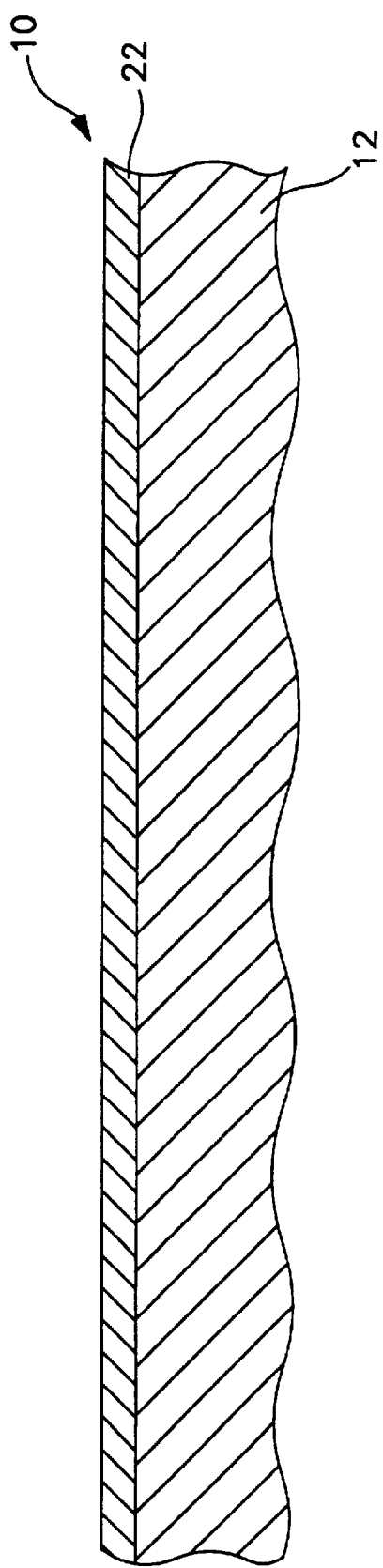
FIGS. 3–7 are cross-sectional views, not to scale, of a portion of a semiconductor chip during the manufacturing processes therefor.
Figure 4:
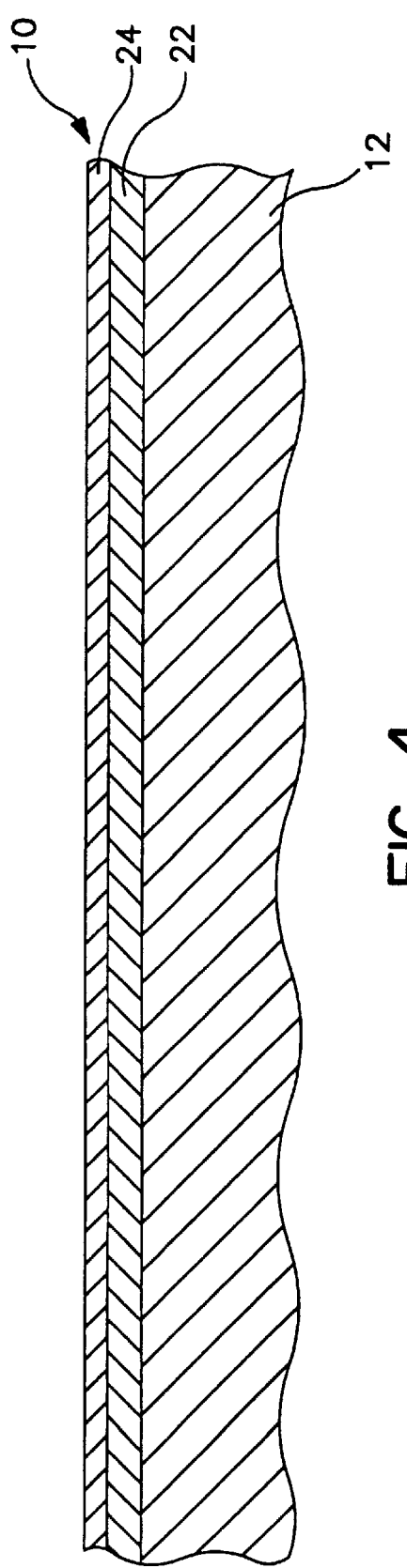

Once the surface 42 of the chip 10 is substantially planarized with planarizing layer 16, the nozzle plate 20 may be attached to the planarizing layer 16 using adhesive 44 (FIG. 2). The nozzle plate 20 may be made of metals or plastics and is preferably made of a polyimide polymer which is laser ablated to provide the ink chamber 30, nozzle hole 32 and an ink supply channel 46 therein. The adhesive layer 44 is preferably any B-stageable material, including some thermoplastics. Examples of B-stageable thermal cure resins include phenolic resins, resorcinol resins, urea resins, epoxy resins, ethylene-urea resins, furane resins, polyurethanes, and silicon resins. Suitable thermoplastic, or hot melt, materials include ethylene-vinyl acetate, ethylene ethylacrylate, polypropylene, polystyrene, polyamides, polyesters and polyurethanes. The adhesive layer 44 is about 1 to about 25 microns in thickness. In the most preferred embodiment, the adhesive layer 44 is a phenolic butyral adhesive such as that used in RFLEX R1100 or RFLEX R1000 films, commercially available from Rogers of Chandler, Ariz.

A flexible circuit or tape automated bonding (TAB) circuit is attached to the nozzle plate/chip assembly 20/10 to provide a printhead structure. The printhead structure is preferably adhesively attached to a printhead body portion to provide a printhead for an ink jet printer.

As set forth above, the invention significantly improves adhesion between the planarizing layer 16 and the chip surface 42. While not desiring to be bound by theory, it is believed that dry etching the chip surface 42 in an oxygen atmosphere prior to attaching the planarizing layer 16 to the surface 42 may sufficiently oxygenate and/or clean the surface 42 and provide adhesion improvement between the planarizing layer 16 and the surface 42. It is believed that reactive ion etching (RIE) deep reactive ion etching (DRIE) or inductively coupled plasma (ICP) etching generates gaseous oxygen ions which impact the chip surface 42 substantially perpendicular to the chip surface 42. The directionality of the gaseous ions in the etching chamber distinguishes such processes from a non-directional movement of ions in conventional plasma processes.

Operating parameters for the etching process are also important to achieving the desired adhesion improvement. The same adhesion enhancing effect is not evident with all operating parameters. For example, the preferred RF power for RIE ranges from about 200 to about 400 watts with about 300 watts being particularly preferred. The reaction chamber pressure is also important to achieving suitable results. The pressure preferably ranges from about 200 to about 650 milliTorr, most preferably from about 450 to about 600 milliTorr. The gas used to generate plasma in the reaction chamber is particularly important to effective enhancement of adhesion. Accordingly, it is preferred to use a plasma gas consisting essentially of oxygen. Oxygen is delivered to the reaction chamber at a flow rate ranging from about 100 to about 300 standard cubic centimeters per minute (sccm), most preferably from about 200 to about 250 sccm. RIE treating time should be sufficiently long to effect oxygenation and/or cleaning of the chip surface but not so long that significant reduction in the surface layers is effected. A preferred RIE treating time ranges from about 30 to about 120 seconds, most preferably about 60 seconds. For example, RIE at 100 watts power, 100 millitorr and pure oxygen for 1 to 10 minutes was not found to increase adhesion between the surface 42 of a semiconductor chip and a planarizing layer 16 applied to the surface 42.

While the foregoing invention has been described with reference to a thermal ink jet printer, the invention is adaptable to use in fabricating a piezoelectric ink jet printer. In this case, the chip surface to which the planarizing layer 16 is applied is on a side of the silicon 12 opposite the surface to which the nozzle plate 20 is attached. However, since the chip 10 containing the piezoelectric devices is adhesively attached to a printhead body, it is desirable to include planarizing layer 16 to provide a planar surface for such adhesive attachment. Activation of the device surface of a piezoelectric type chip to improve adhesion between the planarizing layer 16 and the device surface provides similar advantages for the construction of piezoelectric printheads.

Having described various aspects and embodiments of the invention and several advantages thereof, it will be recognized by those of ordinary skills that the invention is susceptible to various modifications, substitutions and revisions within the spirit and scope of the appended claims.

What is claimed is:

1. An ink jet printer printhead containing a chip, said printhead being made by a procedure comprising the following steps:

providing an ink jet printer printhead structure which contains a semiconductor chip wafer surface;

depositing one of conductive, resistive, and insulative materials to said semiconductor chip wafer surface and patterning the materials to define a wafer surface containing active devices thereon;

treating said wafer surface containing active devices thereon with a dry etch process under an oxygen atmosphere for a period of time and under conditions sufficient to substantially activate the surface of the wafer, and applying a polymeric planarizing film to the activated surface of the wafer, whereby adhesion between the planarizing film and the activated wafer surface is increased as compared to adhesion between a planarizing film and a wafer surface in the absence of the dry etch treatment of the wafer surface.

2. The printhead as recited in claim 1, wherein the dry etch process is selected from a group comprising one of: reactive ion etching and deep reactive ion etching.

3. The printhead as recited in claim 1, wherein the polymeric film comprises an epoxy-based material.

4. The printhead as recited in claim 1, wherein the film is applied with a thickness ranging from about 1 micron to about 20 microns.

5. The printhead as recited in claim 1, wherein the semiconductor chips contain heater resistors.

6. The printhead as recited in claim 1, wherein the semiconductor chips contain piezoelectric actuators.

7. The printhead as recited in claim 1, wherein the treating step is conducted at a power ranging from about 200 to about 400 watts.

8. The printhead as recited in claim 1, wherein the treating step is conducted at a pressure of about 450 millitorr to about 600 millitorr.

9. The printhead as recited in claim 1, wherein the treating step is conducted for period of time ranging from about 30 seconds to about 120 seconds.

10. The printhead as recited in claim 9, wherein the treating step is conducted for period of time ranging from about 50 seconds to about 70 seconds.

11. A semiconductor chip for an ink jet printhead, the chip comprising silicon having a device surface and one or more metal and metal oxide providing active devices patterned on the device surface, the device surface being activated for bonding a planarizing film thereto, and a planarizing film attached to and covering at least a portion of the activated surface of the semiconductor chip, wherein the surface is activated by treating the surface with a dry etch process under oxygen atmosphere thereby providing increased adhesion between the planarizing film and the device surface.

12. The semiconductor chip of claim 11 wherein the planarizing layer is an epoxy-based layer.

13. The semiconductor chip of claim 11 wherein the surface having increased adhesion is a reactive ion etched activated surface.

14. The semiconductor chip of claim 11 wherein the surface is an inductively coupled plasma etched activated surface.

15. The semiconductor chip of claim 11 wherein the semiconductor chip comprises a thermal printhead chip.

16. The semiconductor chip of claim 11 wherein the semiconductor chip comprises a piezoelectric chip.

* * * * *